United States Patent
Twu et al.

(10) Patent No.: US 6,211,098 B1
(45) Date of Patent: Apr. 3, 2001

(54) WET OXIDATION METHOD FOR FORMING SILICON OXIDE DIELECTRIC LAYER

(75) Inventors: Jih-Churng Twu, Taipei; Syun-Ming Jang; Chen-Hua Yu, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/252,337

(22) Filed: Feb. 18, 1999

(51) Int. Cl.⁷ .................................................. H01L 21/26
(52) U.S. Cl. .............................................................. 438/787
(58) Field of Search ...................... 438/765, 766, 438/769, 770, 762, 649, 787, 790, 651, 655, 683, 383, 384

(56) References Cited

U.S. PATENT DOCUMENTS

| 5,210,056 | * | 5/1993 | Pong et al. ............................ 437/239 |
| 5,244,843 | | 9/1993 | Chau et al. ........................... 437/239 |
| 5,470,611 | | 11/1995 | Yang et al. ......................... 427/255.4 |
| 5,877,085 | * | 3/1999 | Matsubara ............................. 438/649 |
| 5,965,915 | * | 10/1999 | Yamazaki et al. .................... 257/346 |
| 6,025,280 | * | 2/2000 | Brady et al. .......................... 438/762 |

* cited by examiner

*Primary Examiner*—David Nelms
*Assistant Examiner*—David Nhu
(74) *Attorney, Agent, or Firm*—George O. Saile; Stephen B. Ackerman

(57) ABSTRACT

A method for forming a silicon oxide gate oxide dielectric layer upon a silicon semiconductor substrate employed within a microelectronics fabrication. There is provided a silicon semiconductor substrate. There is then formed upon the silicon semiconductor substrate, empolying thermal annealing of the silicon semiconductor substrate at an elevated temperature in a gas mixture of oxygen, hydrogen and a diluent gas, a silicon oxide gate oxide dielectric layer with enhanced dielectric properties and more precise control of the silicon oxide dielectric layer thickness.

7 Claims, 2 Drawing Sheets

WET OXIDATION METHOD FOR FORMING SILICON OXIDE DIELECTRIC LAYER

BACKGROUND OF THE INVENTION

1. Field of the Invention

The invention relates to the manufacture of semiconductor microelectronics fabrications. More particularly, the invention relates to a method for forming gate oxide insulation employed in field effect transistors within semiconductor integrated circuit microelectronics fabrications.

2. Description of the Related Art

Modern microelectronics technology is largely based on the ability to fabricate electronically functional devices of such small dimensions within semiconductor single crystal substrates that the density of electronic devices is approaching $10^6$ per square centimeter. This density has been achieved by constant improvements in the methods and materials employed within the microelectronics fabrication art, and by development of ever more simple and compact device designs and structure, Thus, the field effect transistor (FET) is about one order of magnitude smaller in may important aspects of its incorporation into a semiconductor integrated circuit microelectronics fabrication than a comparable bipolar transistor (BIP). It has become increasingly more desirable to employ such field effect transistor (FET) devices in the design of large arrays of electronic circuits to be implemented as semiconductor integrated circuit microelectronics fabrications. Although many forms of the FET device are known, the most widely employed embodiment is the semiconductor FET device fabricated within a silicon single crystal substrate. Such field effect transistor (FET) devices commonly employ a metallic or other conductive material as the gate electrode layer and a dielectric material such as silicon oxide as a gate insulating layer upon a semiconductor substrate, and are therefore commonly referred to as metal-oxide-semiconductor (MOS) devices.

A critical component of a field effect transistor is the gate insulation layer. This gate insulation layer comprises a thin dielectric layer across which an electrical potential between an adjacent gate electrode and a semiconductor channel formed between source and drain regions controls the density of electrical charge carriers in the semiconductor channel. Thus the potential difference or voltage on the gate electrode modulates the flow of current in the FET device between source and drain regions without the gate electrode itself conducting any electric current, since the gate dielectric layer blocks any such current form flowing. Thus the FET device operates with a high input impedance which can be readily switched from a conducting to a non-conducting state, which is an important characteristic in the functioning of microelectronics circuit applications.

In order for the FET device to operate efficiently, the gate insulation layer is desirable as thin as is practicable so that the electric field due to the voltage on the gate electrode can be high for small values of the applied gate voltage. From a different perspective, the gate insulation capacitance is desirably as high as practicable, so that the induced charge carrier density in the conduction channel adjacent to the gate insulation region is also high for a given applied voltage. This is equivalent to requiring as thin a gate insulation dielectric layer as is practicable, as before. Typically, the silicon oxide gate insulation in a silicon semiconductor FET device is of the order of 100–200 angstroms in thickness, with applied gate voltages of the order of 5 volts, so that the electric field within the silicon oxide gate oxide is about $2.5 \times 10^6$ to about $5 \times 10^6$ volts/centimeter. This electric filed is not far below the maximum electric field that a silicon oxide dielectric material can withstand without electrical breakdown.

The gate insulation for a silicon field effect transistor (FET) device is typically formed by thermal oxidation of silicon to form a silicon oxide dielectric layer, empolying methods and materials developed to produce within that silicon oxide dielectric layer a high quality dielectric material in terms of freedom from defects and uniformity of physical properties. It has been found that high purity oxygen to which certain other high purity gases have been added is the most satisfactory medium for the thermal oxidation of silicon to form useful silicon oxide gate insulation for FET devices within silicon semiconductor integrated circuit microelectronics fabrications, for example, additional gases including but not limited to halogen containing gases such as hydrogen chloride and trichloroethane and reducing gases such as hydrogen and water vapor have been reported to produce beneficial effects when added to pure oxygen to form the silicon oxide gate insulation by thermal oxidation.

Although the thermal oxidation of silicon in high purity oxygen with added gases to form the silicon oxide gate insulation is widely practiced, it is not without problems. The rate of formation of the silicon oxide and the microstructure of the silicon oxide layer are often less than optimum with respect to controlling the thickness and uniformity of the silicon oxide gate oxide layer, which leads to problems in the design, manufacture, yield, performance and reliability of the integrated circuit microelectronics fabrications employing the FET devices.

It is therefore towards the goal of forming within a silicon semiconductor substrate within a semiconductor integrated circuit microelectronics fabrication an improved silicon oxide gate oxide layer that the present invention is more specifically directed.

Various methods and materials have been disclosed within the are of semiconductor integrated circuit microelectronics fabrication to form the silicon oxide gate oxide insulation of silicon FET devices.

For example, Pong et al., in U.S. Pat. No. 5,210,056, disclose a method for forming silicon oxide gate oxide dielectric layers with improved resistance to electrical breakdown. The method employs annealing of a silicon substrate in nitrogen while increasing the temperature to a level where oxidation of the silicon will take place, and then changing the gaseous environment to a mixture of oxygen and hydrogen to form the silicon oxide in a "wet" oxidizing ambient, followed by a second annealing in nitrogen while first raising the substrate temperature further and then lowering it to the starting point. The method produces silicon oxide dielectric layers with improved resistance to electrical breakdown, presumably by reducing the incidence of defects such as micropores and excessively thin regions in the silicon oxide dielectric layer.

Further, Chau et al., in U.S. Pat. No. 5,244,843, disclose a method for forming silicon oxide dielectric layers suitable for use as gate oxide dielectric layers at thicknesses below 100 angstroms. The method employs a multiple oxidation of a silicon substrate, first in dry oxygen with added trichloroethane, which is then followed by oxidation in a "wet" environment of water vapor formed by pre-combustion ("torching") of oxygen and hydrogen to form the water vapor. Finally, an annealing or stabilization step and return to initial conditions is performed in a nitrogen environment. Thicker composite silicon oxide layers may be formed by depositing a first silicon oxide dielectric layer upon the silicon substrate followed by the method of the invention upon which a second silicon oxide layer is formed by a deposition method.

Finally, Yang et al., in U.S. Pat. No. 5,470,611, disclose a method for forming a composite silicon oxide dielectric layer fo ruse as a gate oxide dielectric layer in a MOS device. The method employs a first silicon oxide dielectric layer deposited by low pressure chemical vapor deposition (DVD) upon a silicon substrate followed by thermal oxidation in a wet environment produced by pre-combustion of oxygen and hydrogen to form a second silicon oxide dielectric layer intermediate between the substrate and the first silicon oxide dielectric layer.

Desirable in the art of microelectronics fabrication are additional methods and materials useful in forming improved gate oxide dielectric layers within substrates employed within microelectronics fabrications. More particularly desirable are methods for forming silicon oxide gate oxide dielectric layers with improved properties and better control of the formation process within silicon semiconductor substrates empolying thermal oxidation environments.

It is towards these foregoing goals that the present invention is generally and specifically directed.

SUMMARY OF THE INVENTION

A first object of the present invention is to provide a method for forming a dielectric layer upon a semiconductor substrate employed within a microelectronics fabrication.

A second object of the present invention is to provide a method in accord with the first object of the present invention for forming upon a silicon semiconductor substrate employed within a semiconductor integrated circuit microelectronics fabrication a silicon oxide gate oxide dielectric layer.

A third object of the present invention is to provide a method in accord with the first object of the present invention or the second object of the present invention, where the method is readily commercially implemented.

In accord with the objects of the present invention, there is provided a method for forming a silicon oxide gate oxide layer upon a silicon semiconductor substrate employed within a microelectronics fabrication by thermal oxidation. To practice the method fo the present invention, there is first provided a silicon semiconductor substrate. There is then employed a mixture of gases comprising oxygen, hydrogen and a diluent gas (DG) in a O2:H2:DG gas flow rate ratio less than about 4:4:20 respectively in a thermal annealing environment to form a silicon oxide gate oxide dielectric layer with more precise control of thickness and improved resistance to dielectric breakdown.

The silicon substrate may be the substrate itself or a silicon or silicon containing microelectronics layer as may be fashioned by methods known in the art of microelectronics fabrication.

The present invention may be employed where the microelectronics fabrication is a semiconductor integrated circuit microelectronics fabrication, a charge coupled device microelectronics fabrication, a solar cell microelectronics fabrication, a ceramics substrate microelectronics or a flat panel display microelectronics fabrication.

The present invention may be employed where the silicon semiconductor substrate or substrate layer is a single crystal silicon substrate or a substrate layer of polycrystalline or amorphous silicon or silicon containing alloy either of intrinsic purity or doped with P- or N-type dopant atoms to afford a desire electrical property as is known in the art of silicon microelectronics fabrication.

The present invention employs a method of thermal annealing of a silicon semiconductor substrate in a mixture of oxygen, hydrogen and a diluent gas or gases which is readily achieved by commercially employed methods and equipment. The method is thus readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the contact of the accompanying drawings, which form a material part of this disclosure, wherein.

DESCRIPTION OF THE PREFERRED EMBODIMENT

The present invention provides a method for forming a dielectric layer upon a silicon semiconductor substrate employed within a microelectronics fabrication. The method of the present invention realizes this object by forming a silicon oxide gate oxide dielectric layer upon a silicon substrate empolying a mixture of oxygen, hydrogen and a diluent gas in a thermal annealing environment at an elevated temperature. The method of the present invention provides better control of the formation of the silicon oxide layer, and the silicon oxide layer so formed has improved properties with respect to precise control of thickness and dielectric breakdown.

Figure 1:
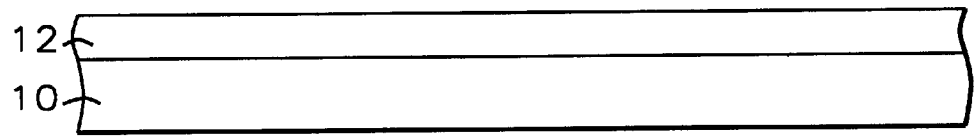
FIG. 1, FIG. 2 and FIG. 3 show a series of schematic cross-sectional drawings illustrating the results of forming within a microelectronics fabrication empolying a silicon semiconductor substrate in accord with a general embodiment of the present invention which comprises a preferred embodiment of the present invention a silicon oxide dielectric gate oxide layer upon the substrate with precise control of thickness and improved resistance to dielectric breakdown.
Figure 2:
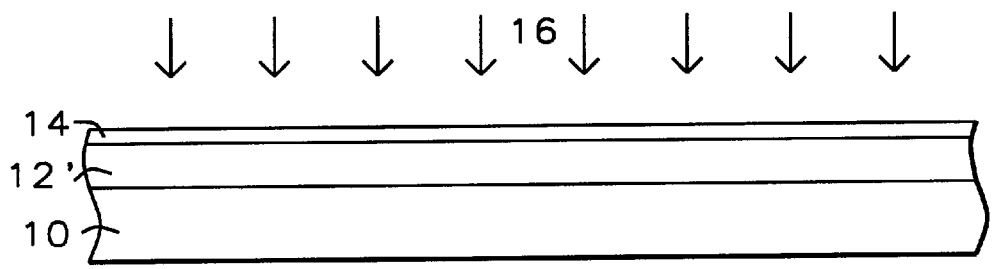
Figure 3:
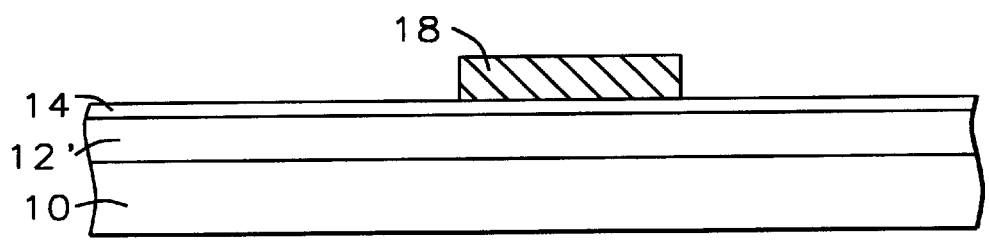

Referring now more particularly to FIG. 1 to FIG. 3, there is shown a series of schematic cross-sectional diagrams illustrating the results of forming upon a silicon semiconductor substrate within a microelectronics fabrication in accord with the method of the present invention a silicon oxide gate oxide dielectric layer with enhanced dielectric breakdown resistance. Shown in FIG. 1 is a schematic cross-sectional diagram of the microelectronics fabrication at an early stage in its fabrication in accord with the method of the present invention. The substrate 10 may have formed upon and over it a silicon semiconductor layer 12 as illustrated in FIG. 1, or alternatively it may be itself be formed of silicon so that that there need be no physical distinction between the substrate 10 if it is a silicon substrate and the silicon layer 12. The substrate 10 may be chosen from a group including but not limited to substrates employed within integrated circuit microelectronics fabrications, ceramic substrate microelectronics fabrications, and flat panel display microelectronics fabrications.

Referring now to FIG. 2, there is shown a schematic cross-sectional diagram of a microelectronics fabrication illustrating the results of further processing of the mciroelectronics fabricaiotn shown in FIG. 1 by the method of the present invention. Shown in FIG. 2 is a microelectronics fabrication otherwise equivalent to the microelectronics fabrication shown in FIG. 1, but where there has been formed a silicon oxide dielectric gate oxide layer 14 employing a thermal annealing environment of the silicon layer 12' in a gas mixture 16 at an elevated temperature.

With respect to the gas mixture 16 shown in FIG. 2, the gas mixture 16 comprises oxygen, hydrogen and a diluent gas. The proportions of the gases in the mixture may range from relative gas flow rates of about 2:1:20 standard cubic centimeters per minute (sccm) to less than 4:4:20 standard cubic centimeters per minute (sccm) respectively for oxygen, hydrogen and the diluent gas. The diluent gas may be selected from the group including but not limited to nitrogen, helium argon neon, krypton, xenon, nitric oxide and nitrogen dioxide. Preferably, the diluent gas employed in the method of the present invention is nitrogen, and the gas flow rate ratio is 2:1:20 for O2:H2:N2 in standard cubic centimeters per minute (sccm). The presence of the diluent gas nitrogen does not result in formation of any components such as silicon nitride or silicon oxynitride within the silicon oxide layer.

With respect to the formation of the silicon oxide layer 14 by thermal annealing of the silicon substrate at elevated temperature, preferably the temperature for forming the silicon oxide layer is from about 600 to about 900 degrees centigrade. Within this temperature range any diluent gas is completely non-reactive with silicon. Preferably the silicon oxide layer 14 is formed to a thickness of from about 80 to about 130 angstroms.

Referring now to FIG. 3, there is shown a schematic cross-sectional diagram illustrating the results of further processing of the microelectronics fabrication whose schematic cross-sectional diagram is shown in FIG. 2, by the method of the present invention. Shown in FIG. 3 is a microelectronics fabrication otherwise equivalent to the microelectronics fabrication shown in FIG. 2, but wherein there has been formed upon the silicon oxide gate oxide dielectric layer 14 a patterned microelectronics conductor layer 18.

With respect to the patterned microelectronics conductor layer 18, the patterned conductor layer 18 may be formed fo metals, semiconductors, alloys and conductive compound including but not limited to aluminum, copper, gold, platinum, hafnium tungsten, polysilicon, titanium nitride and tungsten silicide empolying methods including but not limited to vacuum thermal evaporation, electron beam evaporation, plating, physical vapor deposition (PVD) sputtering, chemical vapor deposition (CVD) and epitaxial growth methods, Preferably the patterned microelectronics conductor layer 18 is formed from polysilicon or amorphous silicon empolying chemical vapor deposition (DVD) and may be employed as a gate electrode layer in an FET device.

The method of the present invention dilutes the reactive oxidizing gas with an inert diluent gas. This allows more precise control fo the desired thickness to which the silicon oxide gate oxide dielectric layer is to be formed, and may also be an additional factor in enhancing the dielectric properties of the silicon oxide layer so formed. The presence of the diluent gas appears to have no other chemical or physical effect beyond modulating the rate of the oxidation of the silicon substrate.

EXAMPLES

The method of wet thermal annealing in oxygen, hydrogen and nitrogen gases in accord with the present invention was employed to form silicon oxide dielectric layers on silicon substrates which were formed to have both p-type and n-type doped silicon (p Si and n Si) regions. While employing the method of the present invention, thermal annealing at a gas flow rate ratio of respectively 1:2:20 O2:H2N2 gas flow rates in standard cubic centimeters per minute (sccm), was employed to form a blanket layer of silicon oxide and then a series of metal-oxide silicon (MOS) sandwich structures were formed upon the silicon substrates, designated as {1:2:20} employing aluminum as the preferable microelectronics conducting layer material Two other similar series of metal-oxide-silicon (MOS) sandwich structure designated as {2:2:10} and {4:4:20} were also prepared, but wherein the gas flow ratios were respectively 2:2:10 and 4:4:20 standard cubic centimeters per minute (sccm) of O2H2 and N2.

Figure 4:
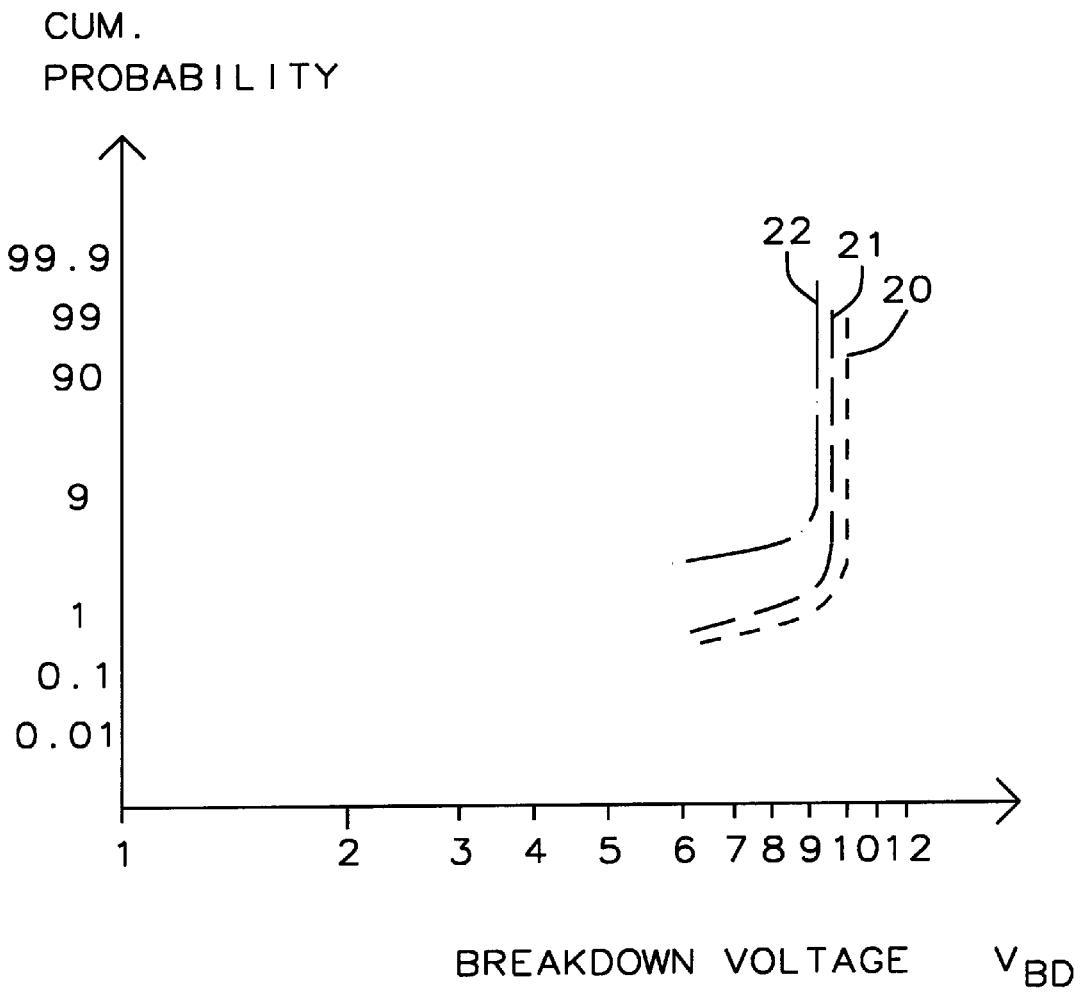
FIG. 4 shows a graph illustrating the results of forming in accord with the method of the present invention a silicon oxide dielectric layer with improved resistance to dielectric breakdown.

The dielectric breakdown voltage of 186 devices from each series of samples were measured employing a wafer acceptance test (WT) system wherein the voltage across the MOS structure is gradually increased while the leakage current is detected. The results of the measurement of dielectric breakdown voltage are shown in FIG. 4, in which is plotted the cumulative probability of the percentage of devices achieving a particular breakdown voltage as a function of the breakdown voltage on log-normal coordinate axes. The mean breakdown voltages and the standard deviation for each series are present in Table I.

TABLE 1

| O2:H2:N2 Ratio (sccm) | Mean Breakdown Voltage, Vbd, volts ± Std. Dev |
|---|---|
| 1:2:20 | 9.1 ± 0.3 (p Si) |
| " | 9.5 ± 0.7 (n Si) |
| 2:2:10 | 8.9 ± 0.3 (p Si) |
| " | 9.3 ± 0.8 (n Si) |
| 4:4:20 | 8.5 ± 0.6 (p Si) |
| " | 8.7 ± 1.0 (n Si) |

It is evident that the maximum value for breakdown is obtained for the series of MOS structures formed by the method of the present invention. In addition, the standard deviation of the breakdown voltage measurements is improved for the samples prepared by the method of the present invention, in accord with the enhanced control of the formation of the silicon oxide layer afforded by the method of the present invention.

As is understood by a person skilled in the art, the preferred embodiment of the present invention is illustrative of the present invention rather than limiting of the present invention. Revisions and modifications may be made in the methods, materials, structures and dimensions of the preferred embodiment to effect other embodiment to effect other embodiments of the present invention without departing form the spirit and scope of the present invention, as defined by the appended claims.

What is claimed is:

1. A method for forming a silicon oxide gate oxide dielectric layer comprising:

providing a silicon semiconductor substrate;

annealing thermally the silicon semiconductor substrate within a thermal annealing and reactive oxidizing environment comprising oxygen, hydrogen and a diluent gas to form a silicon oxide layer upon the silicon substrate, said diluent gas having no chemical or physical effect beyond modulating the rate of oxidation of said silicon substrate.

2. The method of claim 1 wherein the presence of the diluent gas within the thermal annealing environment provides more precise control fo the silicon oxide dielectric layer thickness.

3. The method of claim 1 wherein the diluent gas is selected from the group consisting of:

nitrogen;

helium;

neon;

argon;

krypton;

xenon;

nitric oxide; and nitrogen dioxide.

4. The method of claim 1 wherein:

the diluent gas is nitrogen; and the silicon oxide dielectric layer is formed without forming a silicon nitride component to the silicon oxide layer.

5. The method of claim 1 wherein the oxygen (O2), hydrogen (H2) and diluent (DG) gases are employed for form the silicon oxide dielectric layer in a O2:H2:DG flow rate ratio of about 2:1:20 standard cubic centimeters per minute (sccm) but less than 4:4:20 standard cubic centimeters per minute (sccm).

6. The method of claim 5 wherein the thermal annealing takes place at a temperature of from about 600 degrees centigrade to about 900 degrees centigrade.

7. The method of claim 6 wherein the silicon oxide gate dielectric layer is formed with improved resistance to dielectric breakdown.

* * * * *